United States Patent [19]

Roth et al.

[11] Patent Number: 5,286,674
[45] Date of Patent: Feb. 15, 1994

[54] METHOD FOR FORMING A VIA STRUCTURE AND SEMICONDUCTOR DEVICE HAVING THE SAME

[75] Inventors: Scott S. Roth; Howard C. Kirsch, both of Austin, Tex.

[73] Assignee: Motorola, Inc., Schaumburg, Ill.

[21] Appl. No.: 844,044

[22] Filed: Mar. 2, 1992

[51] Int. Cl.$^5$ .............................................. H01L 21/44
[52] U.S. Cl. ...................... 437/190; 437/195; 437/194; 437/298
[58] Field of Search .............. 437/984, 195, 194, 190, 437/228

[56] References Cited

U.S. PATENT DOCUMENTS

| 4,641,420 | 2/1987 | Lee ........................................ 29/511 |
| 4,943,539 | 7/1990 | Wilson et al. ........................ 437/195 |

FOREIGN PATENT DOCUMENTS

| 0326293 | 8/1989 | European Pat. Off. ............ 437/195 |
| 0184741 | 10/1983 | Japan ................................. 437/195 |
| 0161048 | 9/1984 | Japan ................................. 437/195 |
| 0169151 | 9/1984 | Japan ................................. 437/195 |
| 0200439 | 11/1984 | Japan . |
| 0039849 | 3/1985 | Japan . |
| 0145817 | 6/1987 | Japan ................................. 437/195 |
| 0015923 | 1/1992 | Japan ................................. 437/195 |

Primary Examiner—Tom Thomas
Assistant Examiner—Trung Dang
Attorney, Agent, or Firm—Patricia S. Goddard

[57] ABSTRACT

A semiconductor device (20) makes contact between a first metal line (22) and an overlying second metal line (24) without the need for a conductive landing pad. Sidewall spacers (30) are formed adjacent sides of metal lines (22) such that during formation of a via (34) in an overlying dielectric layer (32), the sidewall spacer prevent trenching of underlying dielectric layer (28) if the via is misaligned. The sidewall spacers are formed of a dielectric material which has an etch rate which is significantly slower than the etch rate of dielectric layer (32). In another embodiment, portions of the sidewall spacers are selectively removed prior to depositing a second metal layer (42). Upon depositing the second metal layer, the side of metal line (22) is locally clad with the second metal to increase contact area and lowering contact resistance.

20 Claims, 2 Drawing Sheets

METHOD FOR FORMING A VIA STRUCTURE AND SEMICONDUCTOR DEVICE HAVING THE SAME

FIELD OF THE INVENTION

The present invention relates to semiconductor devices in general, and more specifically to contact structures in semiconductor devices and methods for making the same.

BACKGROUND OF THE INVENTION

As semiconductor devices, such as integrated circuits, become more and more complex, additional individual components are included in the device for increased performance and cost effectiveness. It is necessary that individual components in devices be made increasingly small and tightly packed to avoid excessive increases in the size of the devices as the number of individual components increases. For example, integrated circuits which were once made with conductive lines having widths on the order of 2 μm had hundreds of thousands of transistors. Many integrated circuits now have over a million transistors. To prevent the integrated circuit size from growing proportionately with the number of transistors, the width of conductive lines used to make the transistor was reduced to on the order of 0.5 μm. As device performance and complexity increases, these line widths are expected to be made even narrower.

With feature sizes decreasing, it is becoming more difficult for semiconductor manufactures to align one feature relative to another and to control size tolerance as a function of nominal feature size. To overcome this difficulty, manufacturers try to incorporate as many self-aligned features in the manufacturing process as possible. However, some features make self-alignment or alignment insensitivity very complex or expensive to achieve. For instance, semiconductor devices often include two or more metal layers which are separated by one or more dielectric layers. In some portions of the device, it is necessary to make contact between the two metal layers. Most conventional device manufacturing processes do not have self-aligned processes for making contact between a first metal layer and a second metal layer. Because self-aligned first metal-to-second metal contacts are not typically used, and because features sizes of the first and second metal layers are becoming smaller, contact alignment is exceedingly critical and difficult. Any misalignment of the contact may result in short circuiting the second metal layer to a conductive feature other than, or in addition to, the first metal layer.

One method in which semiconductor manufacturers have overcome alignment difficulties is by creating a conductive landing pad in a metal line of the first metal layer. The conductive landing pad is made wider than the minimum metal width to provide additional contacting area, thereby establishing an additional alignment tolerance. A semiconductor device 10 utilizing a conductive landing pad is illustrated in FIG. 1. A cross-sectional view of device 10 taken along the line 2—2 of FIG. 1 is illustrated in FIG. 2. Device 10 includes a first metal line 12 made from a first metal layer and an overlying second metal line 14 made from a second metal layer. As indicated in FIG. 2, the two metal lines overly a substrate 11, which is typically silicon or another semiconducting material. A first dielectric layer 13 electrically isolates first metal line 12 from substrate 11, and a second dielectric layer 15 electrically isolates the first metal line from overlying conductive layers which may be present. In conventional semiconductor devices there may also be several other intervening layers between the first and second metal layers and the substrate, but for the sake of clarity only first and second dielectric layers 13 and 15, respectively, are illustrated. To make contact between the first and second metal lines, a contact opening or via 16 is formed in second dielectric layer 15 using conventional lithography and etching techniques. Upon depositing the second metal layer, the second metal fills via 16, thereby creating an electrical contact between first metal line 12 and second metal line 14.

In order to establish a good and reliable electrical contact between the two layers, it is desirable to make via 16 as large as possible to maximize the contact area between the two metal layers. A maximum contact area minimizes contact resistance and improves signal quality and speed between conductive layers. As illustrated in FIG. 1, the diameter of via 16 is nearly equal to the minimum width of first metal line 12. Because the size of the via is very close to that of a minimum line, there is very little alignment tolerance in forming the via. As illustrated in FIG. 3, if via 16 is slightly misaligned, trenching of underlying dielectric layers, such as first dielectric layer 13, may occur during formation of the via. After depositing the second metal layer, metal line 14 fills in the trenched portion of dielectric layer 13, making unwanted contact with substrate 11, or to another conductive region (not illustrated).

As mentioned above, some manufacturers include a conductive landing pad, such as landing pad 18 of device 10 in FIG. 1, to reduce the chances of short circuiting the second metal line 14 to underlying conductive features as a result of via misalignment. Landing pad 18 is formed as part of first metal line 12, and is positioned directly beneath via 16. Since the landing pad is wider than the minimum width of metal line 12, misalignment of via 16 will not be detrimental. As illustrated in FIG. 2, via 16 can be slightly misaligned to either the right or left, yet still lie completely over landing pad 18. With the additional conductive area available, it is less likely that via 16 will fall off the landing pad and trench into underlying dielectric layers.

Although landing pads significantly improve the ability to make reliable contacts between two conductive layers, utilization of landing pads also has a disadvantage. Because a landing pad essentially increases the width of a portion of a metal line, landing pads limit contacted metal line density in a device. Device design rules typically require metal lines to be separated by at least a minimum distance in order to lithographically define and etch the space between adjacent metal lines and to prohibit excessive capacitive coupling between adjacent lines. Since a landing pad is more or less an extended region of a metal line, the minimum distance to an adjacent metal line must be measured from the edge of the landing pad, not from the narrower region of the line. Metal lines with landing pads cannot be formed on as tight a pitch as metal lines without landing pads. For a given number of contacted metal lines, a device which includes landing pads will therefore be larger in area than a device which does not utilize landing pads. Therefore, it would be beneficial if contact between overlying conductive lines could be accomplished reliably without using landing pads and without otherwise increasing device size.

SUMMARY OF THE INVENTION

In accordance with one embodiment of the present invention, a semiconductor device is fabricated by providing a semiconductor substrate. A first interconnect of a first metallic material is formed over the substrate and has sides. A first dielectric material is formed adjacent a side of the first interconnect and has a first etch rate. A second dielectric material is formed over the first dielectric material and the first interconnect. The second dielectric material has a second etch rate which is substantially faster than the first etch rate. A portion of the second dielectric material is removed to form a via which overlies a portion of the first interconnect. The portion of the second dielectric material is removed selectively to the first dielectric material. A second metallic material is deposited such that the via is filled with the second metallic material to form a contact to the first metallic interconnect.

These and other features, and advantages, will be more clearly understood from the following detailed description taken in conjunction with the accompanying drawings. It is important to point out that the illustrations may not necessarily be drawn to scale, and that there may be other embodiments of the present invention which are not specifically illustrated.

DETAILED DESCRIPTION OF A PREFERRED EMBODIMENT

The present invention enables reliable contact to be made between two overlying conductive layers of a semiconductor device, without use of a conductive landing pad and without increasing device size. In one embodiment of the present invention, contact between two conductive layers is made with sufficient alignment tolerance by utilizing two dielectric materials with substantially different etch rates. The first dielectric material has a slower etch rate than the second dielectric material, and is used to prevent trenching during formation of a via in the second dielectric material. In another embodiment of the present invention, the first dielectric material with the slower etch rate is formed as sidewall spacers adjacent a first metal line. After forming a via in the second dielectric material, the sidewall spacers are selectively removed, such that upon depositing an overlying second metal layer, the first metal is locally clad with the second metal to increase contact area.

Figure 1:
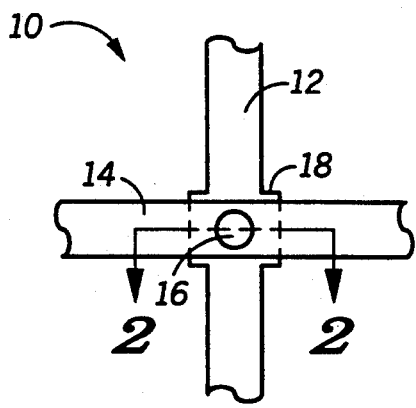
FIg. 1 is a top view of a conventional semiconductor device which includes a landing pad to increase contact alignment tolerance.
Figure 2:
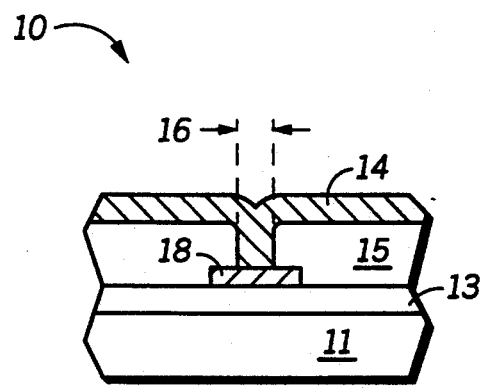
FIG. 2 is a cross-sectional view of the device of FIG. 1 taken along the line 2—2.
Figure 3:
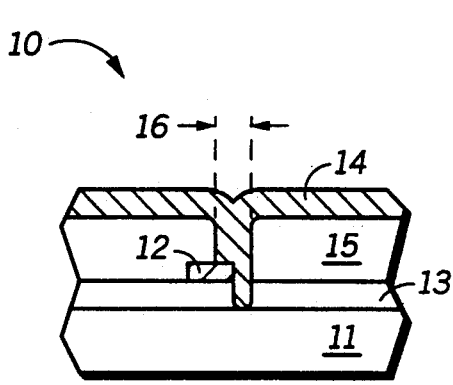
FIG. 3 is a cross-sectional view of the device of FIG. 1 in which a via between two conductive layers is misaligned.
Figure 4:
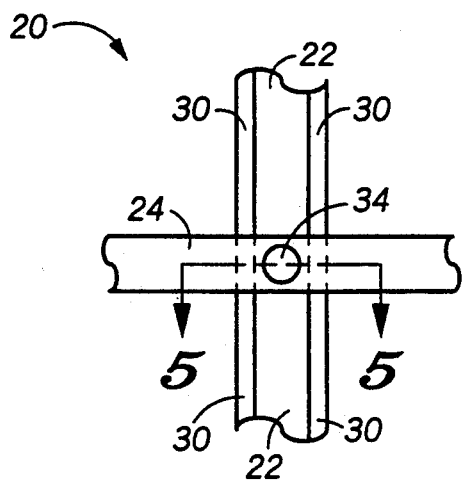
FIg. 4 is a top view of a semiconductor device in accordance with the present invention.
Figure 5:
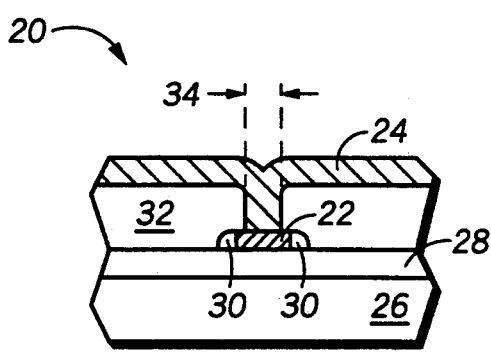
FIG. 5 is a cross-sectional view of the device of FIG. 4 taken along the line 5—5.

FIG. 4 is a top view of a semiconductor device 20 in accordance with the present invention. Device 20 is also illustrated in FIG. 5 which is a cross-sectional view of the device taken along line 5—5 of FIG. 4. As illustrated in FIGS. 4 and 5, device 20 includes a first metal line 22 and an overlying second metal line 24. Typically, semiconductor devices include a plurality of metal lines in a plurality of metal layers. But for purposes of clarity, and for understanding the invention, illustrating only one line in two layers of metal is sufficient. Metal lines 22 and 24 are of metallic materials commonly used in semiconductor devices, such as aluminum, tungsten, titanium, copper, or alloys of these materials. Other conductive materials which may be used with the present invention include polysilicon, refractory metal silicides, titanium nitride, and the like. The two metal lines need not be of the same material. A common example of two dissimilar metal layers is the use of aluminum as the first metal layer and tungsten as the second metal layer. In cases where the two metal layers are dissimilar, it may be desirable to use an intermediate adhesion or glue layer. In the previous example, titanium nitride is a frequently used glue layer to improve adhesion between aluminum and tungsten. Intermediate layers between the two metal layers may also be used as diffusion barriers.

Metal lines 22 and 24 of device 20 overlie a substrate 26, as illustrated in FIG. 5. Substrate 26 is most often a semiconductor material such as silicon, gallium arsenide, or other Group III-V or Group II-VI material. Overlying substrate 26 is a dielectric layer 28 which is used to electrically isolate metal line 22 from the substrate. Dielectric layer 28 may be any dielectric material used in semiconductor fabrication, including $SiO_2$, $Si_3N_4$, PSG (phosphorus doped silicate glass), BPSG (boron doped PSG), TEOS (tetra-ethyl-orthosilicate), and the like. Several other intervening layers (not shown) may be present between metal line 22 and substrate 26, but for the sake of clarity only dielectric layer 28 is illustrated. Formed adjacent to sides of metal line 22 are dielectric sidewall spacers 30. Sidewall spacers are formed next to metal line 22 using conventional spacer techniques, such as depositing the spacer material and performing an anisotropic etch. Because the metal material used to form metal line 22 will most likely have a low melting point, for instance less than 500° C., the sidewall spacers should be formed of a material which can be deposited in this temperature range. Specific materials suitable for forming sidewall spacers 30 will be discussed below.

Another dielectric layer 32 overlies dielectric layer 28 and metal line 22. As with the sidewall spacers, dielectric layer 32 should be of a material which can be deposited at temperatures below the melting point of metal line 22. Suitable low temperature dielectrics include doped or undoped $SiO_2$, doped glasses such as PSG and BPSG, or organic dielectrics such as polyimides. Another characteristic of dielectric layer 32 is that the dielectric material used for the layer should have an etch rate which is substantially faster than the etch rate of the material used to form sidewall spacers 30 for a given etch chemistry. In a preferred embodiment of the present invention, the etch rate of dielectric layer 32 is ten times that of sidewall spacers 30. Reasons for differing etch rates will become apparent later in the discussion. If dielectric layer 32 is a doped $SiO_2$, PSG, or BPSG, suitable sidewall spacers materials include, but are not limited to, undoped $SiO_2$, $Si_3N_4$, $Ta_2O_5$, $Al_2O_3$, and organic dielectrics. In order to use some of these materials, low temperature deposition techniques, such as PECVD (plasma enhanced chemical vapor deposition) and ECR (electron cyclotron resonance deposition), may be necessary. Other combinations of the materials for sidewall spacers 30 and dielectric layer 32 which have not been specifically mentioned may also be suitable in practicing the present invention. In choosing appropriate materials, it is important that both sidewall spacers 30 and overlying dielectric layer 32 be low temperature dielectrics which can be deposited without melting metal line 22. It is also important that dielectric layer 32 has a significantly faster etch rate than spacers 30, for reasons to be explained below.

Figure 6:
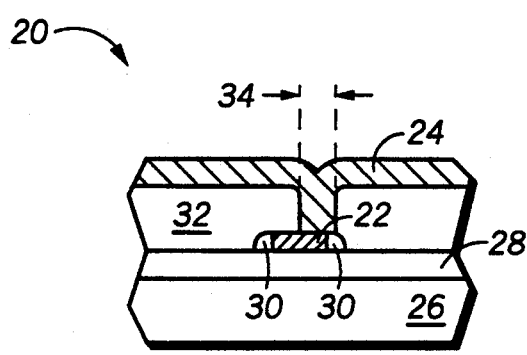
FIG. 6 is a cross-sectional view of the device of FIG. 4 in which a via between two conductive layers is misaligned.

In order to contact metal line 24 to metal line 22, a contact opening or via 34 is formed in dielectric layer 32, as illustrated in FIG. 5. Via 34 is formed in the dielectric layer using conventional lithography and etching techniques. As illustrated in FIG. 5, via 34 is perfectly aligned to metal line 22. However, perfect alignment is difficult to achieve repeatedly. If via 34 is slightly misaligned, the present invention prohibits unwanted trenching of underlying dielectric layer 28 due to the presence of sidewall spacers 30. As indicated earlier, sidewall spacers 30 have a much slower etch rate than dielectric layer 32. From FIG. 6, it is apparent that a slight misalignment of via 34 causes the via to overlie one of the sidewall spacers. Due to the differential in etch rates, the sidewall spacer will not be significantly etched during the formation of via 34 in dielectric layer 32. Therefore, underlying layers are not affected by the formation of the via.

An advantage of using sidewall spacers 30 in accordance with the present invention is that unwanted trenching of underlying dielectric layers, such as dielectric layer 28, is avoided while still providing sufficient contact between metal lines 22 and 24. Furthermore, because a conductive landing pad is not used, metal lines in the first metal layer of a device can be made closer together. Another advantage is that the present invention does not require an additional lithography or alignment step since sidewall spacers 30 are self-aligned to metal line 22. Furthermore, alignment tolerances in forming via 34 are relaxed by an amount equal to the thickness of a sidewall spacer since misalignment of the via is effectively negated by the spacer. The alignment tolerance of forming via 34 can also be tailored simply by varying the width of the spacers.

Figure 7:
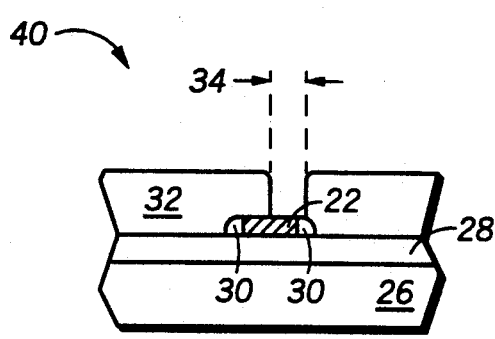
FIGS. 7-10 are cross-sectional views of a method for making contact in a semiconductor device, also in accordance with the present invention.

In another embodiment of the present invention, an additional advantage is achieved, namely that of increasing contact area between two metal layers. FIGS. 7-10 illustrate, by cross-sectional views, a method for forming a semiconductor device 40 having an increased contact area. Because many of the elements of device 40 are similar to those of device 20, illustrated in FIGS. 4-6, the same reference labels are used in both devices. Device 40 is fabricated the same way as device 20, up to and including the step of forming via 34 in dielectric layer 32. In this particular embodiment, it is desirable for via 34 to expose one or both of sidewall spacers 30, as illustrated in FIG. 7. The size of via 34 may made larger than the width of metal line 22 in order to expose the sidewall spacers, but should be small enough to insure that the via does not extend beyond the spacers.

Figure 8:
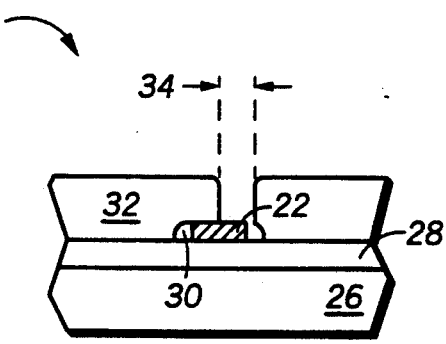

After via 34 is formed, the exposed portions of the sidewall spacers are removed selectively to dielectric layers 28 and 32, as illustrated in FIG. 8. Selective removal of the spacer material can be accomplished using an isotropic chemical dry etch. In order to remove the spacer material without etching the other dielectric materials, material choice is important. More specifically, the material used to form the sidewall spacers should be etchable in a chemistry which does not significantly etch dielectric layers 32 and 28.

One suitable combination of materials is to form sidewall spacers 30 of $Si_3N_4$, dielectric layer 32 of $SiO_2$, and dielectric layer 28 of PSG or BPSG. A reactive ion etch (RIE) using $CHF_3$ and oxygen can be used to form a via in $SiO_2$ without substantial damage to $Si_3N_4$ spacers. The RIE etch selectivity can vary, but the process can be adjusted in a known manner to achieve a selectivity of at least 20:1 (in other words $SiO_2$ etches at least twenty times faster than $Si_3N_4$). After forming a via, $Si_3N_4$ sidewall spacers can be removed selective to an underlying PSG or BPSG layer using a chlorine based, isotropic chemical dry etch which can etch $Si_3N_4$ selective to glass with a selectivity of greater than 50:1.

Figure 9:
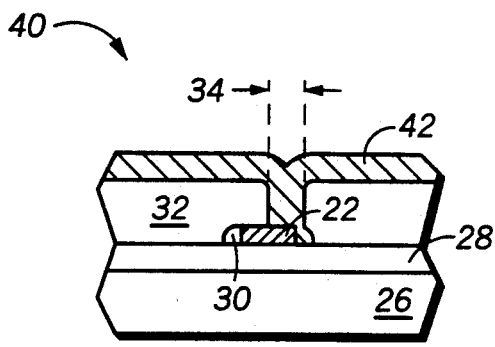
Figure 10:
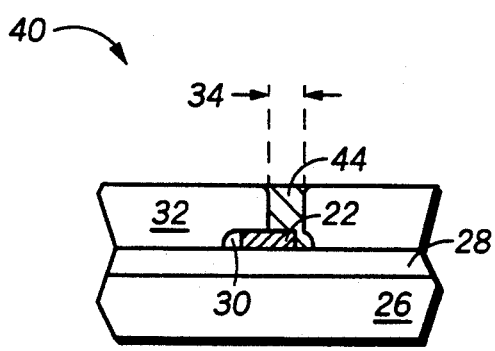

As illustrated in FIG. 9, a second metal layer 42 is deposited once portions of the sidewall spacers have been removed, filling the hole left from removing the spacer material. Due to the size and configuration of the hole, chemical deposition techniques, such as CVD or ECR, are preferred for depositing metal layer 42 as opposed to physical deposition techniques, such as sputtering. Chemical deposition techniques can be deposited horizontally as well as vertically, such that filling the hole created by removing the spacer material is not a problem. Physical deposition techniques, on the other hand, may not adequately fill the hole since dielectric layer 32 forms an overhang over the area to be filled. After second metal layer 42 is deposited, the metal may be patterned to form a metal line, similar to metal line 24 of device 20. Alternatively, the entire metal layer may be etched back to form a plug 44, as illustrated in FIG. 10.

Device 40 has each of the advantages of device 20, and in addition has an increased contact area between the first and second metal layers. Not only does the second metal layer contact the top of metal line 22, as in most conventional devices, but also extends along one or more sides of the metal line to form a localized cladding around metal line 22. Cladding is localized because it only occurs in regions where sidewall spacer material has been removed. Unlike many existing devices which clad metal lines, localized cladding in accordance with the present invention is a self-aligned process since the cladded area is determined by self-aligned sidewall spacers. Although cladding a metal line requires an additional processing step of removing the sidewall spacer material, a significant advantage is an increase in contact area between the two metal layers. Since both the top and at least one side of metal line 22 is in contact with metal layer 42, contact resistance is lowered, thereby increasing signal speed.

An alternative method to forming a via structure and to locally cladding a metal line may be accomplished, in accordance with the present invention, by removing spacers in some areas of the device prior to depositing an overlying dielectric layer. For instance, spacers can be formed only along a portion of a side of a metal line. After forming spacers completely along sides of the metal line as usual, a spacer patterning operation using conventional lithography and etching techniques can be used to remove the spacers from along certain portions of the line. Processing of the device is then similar to that described in reference to FIGS. 7-10 above. By having spacers formed along only a portion of the metal line, subsequent cladding by a second metal occurs only in regions of the device where the patterned spacers were present, as opposed to along an entire side of the metal line.

In addition to providing improved contact area, cladding techniques in accordance with the present invention may also be used to completely encapsulate metal lines with a barrier layer. Much research has been done on replacing conventional aluminum lines with copper lines for an increase in electrical conductivity. However, copper is highly susceptible to corrosion and has a high diffusivity. To protect copper lines from corrosion and unwanted diffusion, it has been proposed that copper lines be completely encapsulated or clad with a barrier material.

Figure 11:
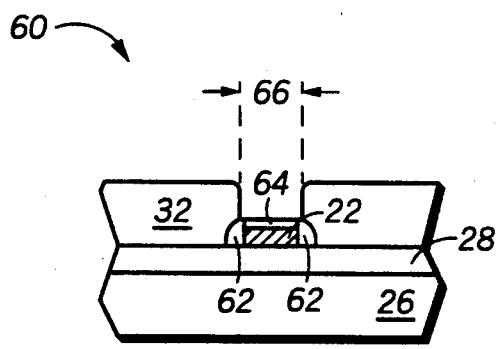
FIGS. 11-12 are cross-sectional views of a semiconductor device illustrating another embodiment of the present invention.
Figure 12:
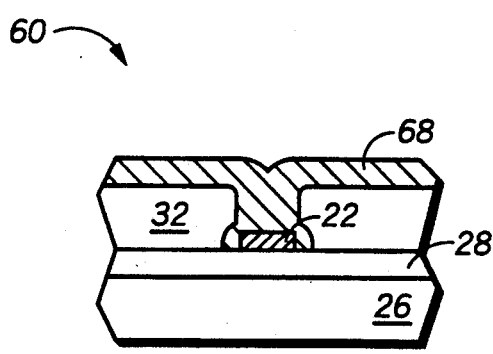

The present method of locally cladding a metal line can also be used to completely clad a metal line, such as a copper interconnect, in a self-aligned manner as demonstrated in the cross-sectional views of FIGS. 11 and 12. A semiconductor device 60 includes many of the same elements of previously described devices; therefore, the same reference labels are used in the various figures. In order to completely clad metal line 22, a top surface of the metal line must be exposed to a subsequent metal deposition. Therefore, an overlying, sacrificial dielectric layer 64 is formed on the metal line. Dielectric layer 64 is preferably patterned at the same time metal line 22 is patterned to avoid unnecessary manufacturing operations. Simultaneous patterning is achieved by depositing the material for dielectric layer 64 over a blanket layer of metal, and patterning both layers to form metal line 22 and overlying dielectric layer 64. Sidewall spacers 62 are then formed adjacent both the metal line and dielectric layer 64, as illustrated in FIG. 11. In a preferred embodiment, sidewall spacers 62 are of the same material as dielectric layer 64. Suitable materials for sidewall spacer 62 and dielectric layer 64 include those previously suggested for use as sidewall spacers 30 of devices 20 and 40.

After metal line 22 is completely encapsulated by dielectric material, dielectric layer 32 is deposited over the device, and is patterned to form a via 66, as illustrated in FIG. 11. As in previous embodiments, formation of the via does not affect dielectric materials other than dielectric layer 32 because of etch selectivity requirements of the materials discussed earlier. Via 66 is illustrated as being wider than metal line 22. The width of via 66 is designed to allow adequate removal of sidewall spacers 62 and dielectric layer 64; however, having the via wider than the metal line may not be required. In a manner similar to that described in reference to FIG. 8, sidewall spacers 62 and overlying dielectric layer 64 are then selectively removed from the device using an isotropic chemical dry etch to expose top and side surfaces of metal line 22.

As illustrated in FIG. 12, a metal layer 68 is then deposited, preferably by CVD or ECR deposition, on device 60 to fill via 66 and clad metal line 22. Metal layer 68 may subsequently be patterned into metal lines, partially etched back to from a conductive plug in the via, or partially removed from the via so that the via may be filled with another material. As a result of depositing metal layer 68, metal line 22 is completely encapsulated on two sides and a top surface, as opposed to localized cladding discussed previously. An advantage in completely encapsulating metal line 22 is that the metal line is protected by a barrier layer, namely metal layer 68. Therefore, metals which in the past have not been used as interconnects due to susceptibility to corrosion and/or high diffusivity can be used in accordance with the present invention because the outer cladded metal functions as a barrier to contamination. Furthermore, the present invention can be used to clad metal lines using self-aligned processes, unlike many existing cladding processes.

The foregoing description and illustrations contained herein demonstrate many of the advantages associated with the present invention. In particular, it has been revealed that reliable contact, with sufficient alignment tolerance, can be made between two overlying conductive layers of a semiconductor device without using area consuming conductive landing pads. Because landing pads are eliminated, conductive lines can be placed closer together, thereby decreasing overall size of the device. Moreover, the present invention can also be used to increase the contact area between the two metal layers by providing a locally cladded region along an underlying metal line. Furthermore, the cladding techniques taught herein can be used to completely clad a conductive line which requires an encapsulating protective barrier layer.

Thus it is apparent that there has been provided, in accordance with the invention, a method for forming a contact structure and a semiconductor device having the same that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, it is not necessary that a dielectric material formed adjacent the sides of a metal line be in the form of sidewall spacers. As an alternative, a dielectric material may be deposited over the entire device, and uniformly etched back such that the dielectric material completely fills the region between two adjacent metal lines. In addition, a device in accordance with the invention is not limited to those specific layers and elements specifically described or illustrated. Semiconductor devices include numerous insulating and conducting layers, many of which have not been illustrated herein for clarity purposes. Similarly, contact between two metal layers may included intervening adhesion layers or diffusion barriers layers which have not been illustrated. It is also important to note that the present invention is not limited in any way to contacting one metal line to another, but may also be practiced using metal plugs, planarized contacts, or any other form of metal interconnect. Furthermore, vias of a device in accordance with the present invention need not be completely filled by a second metal, but may instead be partially filled. Also, the present invention may be practiced using materials other than those specifically listed, provided the appropriate material characteristics as described herein are met. As an example, both inorganic and organic dielectric materials may be used for any of the dielectric layers described herein. Furthermore, various embodiments of the present invention, including each of those described herein, may utilize sidewall spacers or other form of dielectric along an entire length of a metal interconnect or along only a portion of a metal interconnect. Therefore, it is intended that this invention encompass all such variations and modifications as fall within the scope of the appended claims.

We claim:

1. A method of fabricating a semiconductor device comprising the steps of:
   providing a semiconductor substrate;
   forming a first interconnect of a first metallic material overlying the substrate, the first interconnect having a top surface and sides;
   forming a first dielectric material adjacent at least a portion of a side of the first interconnect, the first dielectric material having a first etch rate;
   forming a second dielectric material overlying the first dielectric material and the first interconnect, the second dielectric material having a second etch rate which is substantially faster than the first etch rate;
   removing a portion of the second dielectric material to form a via which overlies a portion of the first interconnect and exposes a portion of the first dielectric material, wherein removing the second dielectric material is accomplished selectively to the first dielectric material;
   selectively removing the exposed portion of the first dielectric material to expose at least a portion of the side of the first interconnect; and
   depositing a second metallic material which fills the via to form a contact to both the top surface and the exposed side of the first metallic interconnect.

2. The method of claim 1 wherein the step of selectively removing the first dielectric material comprises removing the first dielectric material by isotropic chemical dry etching.

3. The method of claim 2 wherein the step of depositing a second metallic material comprises depositing a second metallic material by chemical vapor deposition.

4. The method of claim 1 wherein the step of forming a first dielectric material comprises forming sidewall spacers adjacent the sides of the first interconnect.

5. A method for fabricating a semiconductor device comprising:
   providing a semiconductor substrate having an overlying dielectric layer;
   forming a metallic line on the dielectric layer, the metallic line having a top surface and sides;
   forming a sidewall spacer of a first dielectric material adjacent a side of the metallic line, the first dielectric material having a first etch rate;
   depositing a second dielectric material over the metallic line and the sidewall spacer, the second dielectric material having a second etch rate which is substantially faster than the first etch rate;
   etching a via in the second dielectric material which overlies at least a portion of the metallic line and exposes at least a portion of the sidewall spacer, wherein etching of the second dielectric material is accomplished without substantial etching of the sidewall spacer;
   removing the exposed portion of the sidewall spacer selective to the dielectric layer beneath the metallic line; and
   filling the via with a metallic material to form a contact to the metallic line.

6. The method of claim 5 wherein the step of forming a metallic line comprises forming a line comprised of a material selected from the group consisting of: aluminum, copper, aluminum alloys, and copper alloys.

7. The method of claim 5 wherein the step of depositing a second dielectric material comprises depositing a dielectric material selected from the group consisting of: $SiO_2$, phosphorus doped silicate glass (PSG), boron and phosphorus doped silicate glass (BPSG), and organic dielectrics.

8. The method of claim 5 wherein the step of forming a sidewall spacer comprises forming a sidewall spacer from a material selected from the group consisting of: undoped $SiO_2$, $Si_3N_4$, $Ta_2O_5$, $Al_2O_3$, and organic dielectrics.

9. The method of claim 5 wherein the step of depositing a second dielectric material and the step of forming a sidewall spacer are both accomplished by depositing dielectric material at a temperature less than 500° C.

10. The method of claim 5 wherein the step of depositing a second dielectric material comprises depositing a dielectric material which has an etch rate at least ten times as great as the first etch rate.

11. The method of claim 5 wherein the step of removing the exposed portion of the sidewall spacer comprises isotropically removing the exposed portion of the sidewall spacer.

12. The method of claim 4 wherein the step of forming a sidewall spacer comprises forming a sidewall spacer from a material selected from the group consisting of: undoped $SiO_2$, $Si_3N_4$, $Ta_2O_5$, $Al_2O_3$, and organic dielectrics.

13. The method of claim 1 wherein the step of depositing a second metallic material comprises depositing a material comprised of a metal selected from the group consisting of: aluminum, copper, aluminum alloys, and copper alloys.

14. The method of claim 1 wherein the step of selectively removing the exposed portion of the first dielectric material comprises removing the exposed portion of the first dielectric material to expose two sides of the first interconnect, and wherein the step of depositing a second metallic material comprises depositing a second metallic material which fills the via to form a contact to the top surface and to the two exposed sides of the first metallic interconnect.

15. A method of fabricating a semiconductor device comprising the steps of:
   providing a semiconductor substrate;
   forming a first interconnect of a first metallic material overlying the substrate, the first interconnect having a top surface and two parallel sides;
   forming a hard mask on the top surface of the first interconnect;
   forming a first dielectric material adjacent each of the two sides of the first interconnect, the first dielectric material having a first etch rate;
   forming a second dielectric material overlying the first dielectric material, the first interconnect, and the hard mask, the second dielectric material having a second etch rate which is substantially faster than the first etch rate;
   removing a portion of the second dielectric material to form a via which exposes the hard mask on the first interconnect, wherein removing the second dielectric material is accomplished selectively to the hard mask and the first dielectric material;
   selectively removing the exposed portion of the hard mask and surrounding portions of the first dielectric material to expose at least a portion of the side of the first interconnect; and depositing a second metallic material which fills the via to form a contact to the top surface and at least one side of the first metallic interconnect.

16. The method of claim 15 wherein the step of selectively removing the exposed portion of the hard mask and surrounding portions of the first dielectric material comprises isotropically removing.

17. The method of claim 16 wherein the step of selectively removing the exposed portion of the hard mask and surrounding portions of the first dielectric material comprises removing by isotropic chemical dry etch.

18. The method of claim 16 wherein the step of selectively removing the exposed portion of the hard mask and surrounding portions of the first dielectric material comprises removing portions of the first dielectric material adjacent each of the two sides of the first metallic interconnect.

19. The method of claim 16 wherein the step of depositing a second metallic material comprises depositing a second metallic material to form a contact to the top surface and to the two sides of the first metallic interconnect.

20. The method of claim 16 wherein the hard mask and the first dielectric are comprised of a same material.

* * * * *